US010901691B2

(12) United States Patent
Schuttenberg et al.

(10) Patent No.: US 10,901,691 B2
(45) Date of Patent: Jan. 26, 2021

(54) SYSTEM, METHOD AND APPARATUS FOR INTER-PROCESS COMMUNICATION

(71) Applicant: Arm Limited, Cambridge (GB)

(72) Inventors: Kim Richard Schuttenberg, Gilbert, AZ (US); Jonathan Curtis Beard, Austin, TX (US); Syed Ali Mustafa Zaidi, Cambridge (GB)

(73) Assignee: Arm Limited, Cambridge (GB)

( * ) Notice: Subject to any disclaimer, the term of this patent is extended or adjusted under 35 U.S.C. 154(b) by 45 days.

(21) Appl. No.: 16/261,071

(22) Filed: Jan. 29, 2019

(65) Prior Publication Data

US 2020/0241839 A1 Jul. 30, 2020

(51) Int. Cl.
*G06F 5/06* (2006.01)
*G06F 15/17* (2006.01)
*G06F 30/34* (2020.01)

(52) U.S. Cl.
CPC ............... *G06F 5/06* (2013.01); *G06F 15/17* (2013.01); *G06F 30/34* (2020.01)

(58) Field of Classification Search
CPC ........ G06F 3/0659; G06F 3/0631; G06F 5/06; G06F 30/34; G06F 15/17
See application file for complete search history.

(56) References Cited

U.S. PATENT DOCUMENTS 7,231,638 B2 * 6/2007 Blackmore ............. G06F 9/544
709/212

\* cited by examiner

*Primary Examiner* — Idriss N Alrobaye
*Assistant Examiner* — Richard B Franklin
(74) *Attorney, Agent, or Firm* — Leveque Intellectual Property Law, P.C.

(57) ABSTRACT

A system, apparatus and method for enabling a FIFO-like (first-in-first-out) communication between a plurality of executing processes that are distributed throughout a computing system. Embodiments exploit locality in the hierarchy of the cache memory and communication busses within the computing system to enable the passing of messages or streams of bytes with a low latency and high throughput. In addition, this allows for participating components to be very simple, or very sophisticated, but still benefit from the improved communications patterns.

18 Claims, 14 Drawing Sheets

SYSTEM, METHOD AND APPARATUS FOR INTER-PROCESS COMMUNICATION

BACKGROUND

The communication between processes within a shared memory computing system is usually managed through software, with the OS (operating system) guaranteeing the security of the channel, and the movement of data carried out through shared memory regions, or by the OS playing an intermediary role and reading the data from one process and writing it to another.

This has several down sides, first among them latency of the communication, as it can take several passes back and forth between various hardware agents in the system to pass the data. As an example, a sender may place data in a shared memory region (which often requires the hardware to move the data closer to it in the cache hierarchy). This may alter the value of another location in memory that acts as a flag or semaphore indicating the amount of data available. The sender then may finally request the operating system to send a signal to the receiving process that is waiting for the data. The receiving process will then read the flag or semaphore location requiring data movement through the cache hierarchy, then read the data, which was intended to be transferred in the first place. The second issue is security. As recent events such as Spectre and Meltdown issues have shown, sharing memory regions allows for potential side channel attacks exploiting the associativity of the structured implementing the shared memory.

BRIEF DESCRIPTION OF THE DRAWINGS

The accompanying drawings provide visual representations, which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figure 1:
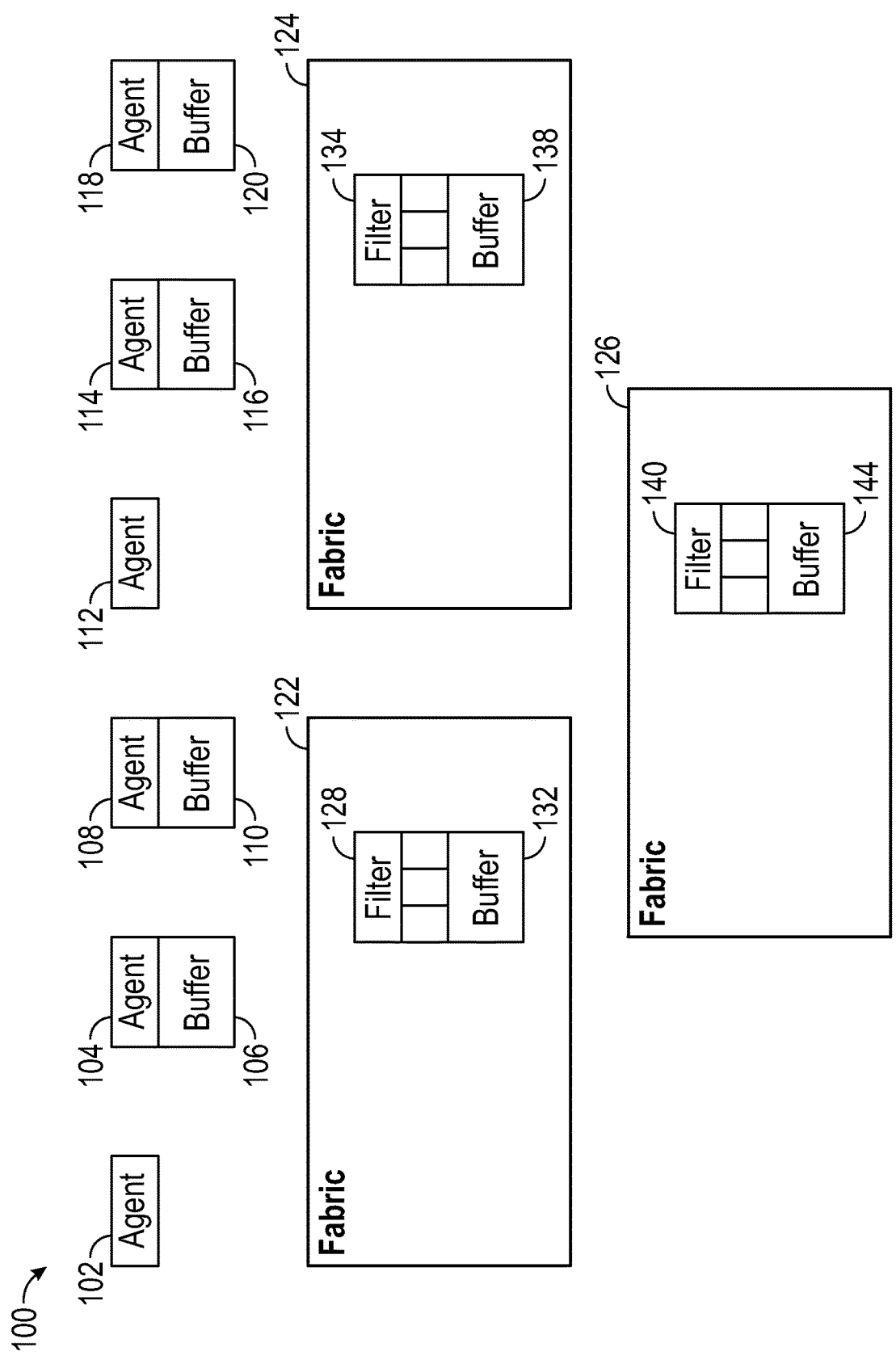
FIG. 1 illustrates a memory structure hierarchy according to an embodiment described herein.

While this disclosure is susceptible of embodiment in many different forms, there is shown in the drawings and will herein be described in detail specific embodiments, with the understanding that the present disclosure is to be considered as an example of the principles described and not intended to limit the disclosure to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprise", "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms mean that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

The following terms may be used in this description of various embodiments of the present disclosure.

Agent: a program or code or hardware module that reacts to its environment and performs some function for an end user or another program.

Auxiliary: additional, supplemental.

Buffer: a temporary storage area, usually in RAM. The purpose of most buffers is to act as a holding area, enabling the CPU to manipulate data before transferring it to a device, agent, or other destination. To differentiate from other common uses of RAM, it is useful to define "a local RAM," as opposed to RAM that is generally used to refer to the system RAM.

Cache: cache memory, also called CPU memory, is random access memory (RAM) that a computer microprocessor can access more quickly than it can access regular RAM. This memory is typically integrated directly with the CPU chip or placed on a separate chip that has a separate bus interconnect with the CPU.

Cache Block: basic unit for cache storage. May contain multiple bytes/words of data. A cache line is the same as cache block. Note that this is not the same as a "row" of cache.

Communication Bus: used to transfer data a between modules, components or devices that are identified by an address of the physical memory (the physical address), which may be stored and enable accessing memory. The data transferred may include read/write/manage commands.

CPU: central processing unit; the electronic circuitry within a computer that carries out the instructions of a computer program by performing the basic arithmetic, logical, control and input/output (I/O) operations specified by the instructions.

Execution: the basic operational process of a computer. It is the process by which a computer retrieves a program instruction from its memory, determines what actions the instruction dictates, and carries out those actions. This cycle is repeated continuously by the central processing unit (CPU), from boot-up to when the computer is shut down.

Fabric: a representation of computing resources such as processors, memory, storage and other components that are interlinked or interwoven with each other to work and operate cohesively.

FIFO: First-in-first-out.

Filter: program or section of code designed to examine each input or output request for certain qualifying criteria and then process or forward it accordingly. A filter is "pass-through" code that takes input data, makes some specific decision about it and possible transformation of it, and passes it on to another program. Usually, a filter does no input/output operation on its own.

Flag: a value that acts as a signal for a function or process.

Flowchart: a type of diagram that represents an algorithm, workflow or process. The flowchart shows the steps as boxes of various kinds, and their order.

Heap Structure: an area of pre-reserved computer main storage (memory) that a program process can use to store data in some variable amount.

Interface: either a hardware connection or a user interface. An interface can also be used as a verb, describing how two devices connect to each other. A hardware interface is used to connect two or more electronic devices together.

Micro-architectural: computer organization, the way a given instruction set architecture (ISA), is implemented in a processor.

I/O: input/output, the transfer of data between a processor and a peripheral device in a data processing system. I/O devices may include keyboards, displays, pointing devices, etc. that can be coupled either directly or through intervening I/O controllers.

Latency: a delay of some type. Typically a delay in transmitting or processing data.

Module: a component or part of a program or device that can contain hardware or software, or a combination of hardware elements and software elements. In a module that includes software, the software may contain one or more routines, or subroutines. One or more modules can make up a program and/or device.

Operation: a single step or plurality of steps performed by a computer in the execution of a program.

Peripheral: a computer device, such as a keyboard or printer, which is not part of the essential computer (i.e., the memory and microprocessor). These auxiliary devices are typically intended to be connected to the computer.

Semaphore: a variable or abstract data type used to control access to a common resource by multiple processes in a concurrent system such as a multitasking operating system.

Source Code: any collection of code, possibly with comments, writen using human readable programming language, usually as plain text. The source code of a program is specially designed to facilitate the work of computer programmers, who specify the actions to be performed by a computer mostly by writing source code. The source code is often transformed by an assembler or compiler, into binary machine code understood by the computer. The machine code might then be stored for later execution. Alternatively, source code may be interpreted and thus immediately executed.

Embodiments described herein are directed to a method for enabling a FIFO-like (first-in-first-out) communication between a plurality of executing processes that are distributed throughout a computing system. The computing system may comprise electronic memory, non-volatile computer memory, RAM, ROM, cache, and other electronic storage, CPUs, processors, communication channels, busses, I/O systems, peripherals and other hardware components suited to support the operating system (O/S). Embodiments exploit locality in the hierarchy of the cache memory and communication busses within the computing system to enable the passing of messages or streams of bytes with a low latency and high throughput. In addition, this allows for participating components to be very simple, or very sophisticated, but still benefit from the improved communications patterns. Embodiments also simplify the connection of accelerators and external communication equipment to the computing system. Security may be maintained by hardware and can be made resistant to many side channel attacks.

Additional embodiments described herein disclose a method that allows the memory and memory handling structures within a computing system to be reconfigured such that they can be used for a low-latency message or byte-stream passing system in parallel with their normal task of managing the memory system. The interface to software is presented as "putting" or "taking" into a FIFO and the OS involvement can end after the initial creation of the memory channel.

Specifically, it is an embodiment that the OS (operating system) can cause any range of physical memory to behave like a FIFO-device, but without the need for the communication to actually travel through the backing physical memory in question. A memory region specified is only used to hold data that has been written into the communication channel but is not read out by in a timely manner. By using the existing namespace of memory to identify the communication channels, existing methods of access control, addressing, and management can be used with minimal changes.

In addition, because the backing memory (usually DRAM) is relatively cheap compared to a dedicated hardware FIFO, and the process of creating the communication channels is controlled by the OS, software can have access to a fast communication channel as long as there is memory available, and the memory requirement is the same or less than classical shared memory communication channels.

For exclusive speculative reads (takes), an issue is that these takes are meant to facilitate when a processor wants to read a message from a communication channel, but the message is larger than the processor is capable of processing in a single operation. It is desirable for the message reading/taking to be effectively atomic, but the processor has to be able to take interrupts between individual operations. The use of exclusive reads is similar to an exclusive read-modify-write, in that a process begins a sequence that flags the message to be taken, starts reading from the message, but and then ends the sequence. The sequence will either succeed if the message was not taken by any other agent, or fail with a retry message if the message was taken by another agent or otherwise invalidated.

The bus protocol may support reading a message without finalizing the take, and tracking if the message being read this way is taken/invalidated.

For the root node migration, placing the root node close to the receiving logic reduces effective latency of the communication channel. For portability reasons, it is not significant to explicitly state the location of the receiving context, and there is a possibility the receiving context may change location (due to process migration, preemption, or changing access patterns).

Root node migration lets the hardware move the root node and any pending data to a new location based on software hints or hardware based behavior analysis. The sequencing of the root node migration depends on if the communication channel requires strict ordering accesses or not. If strict ordering is not required, it is not necessary to physically move the messages to the new root node. For strictly ordered channels, there might be a performance penalty while the root node is moving as the messages are physically relocated.

Alternatively to physically relocating the messages, they could be pushed to the local backing memory and transferred by the coherency protocol (to simplify implantation), or the filtering/directory information could be updated to finalize the migration only once the prior root node has emptied (e.g., new "put" operations go to the new root node, but "take" operations use the old root node until it is emptied).

The creation of a channel, such as a communication channel, begins by the OS marking a region of memory for use by the communication channel. This can be done as an extension of existing memory labeling techniques (such as address translation, memory protection, or memory attribution). The OS can also decide, for each participating process, how it will interact with the communication channel by assigning it permissions. Possible permissions presented here are: "read only", "write only", "read/write", and "manage."

Once the memory has been so marked, the valid access to the memory is defined, typically to be through a small number of commands that treat the memory as a communication channel. Hardware treats other accesses as errors unless the accessor has "manage" permissions (typically, the OS will only grant "manage" permissions to OS components).

Individual processes can then access the channel using commands such as "put" and "take" that combine the data movement and control into one action that propagates efficiently through a hierarchical memory system (such as the cache hierarchies used by many modern CPUs). The individual components of the memory system can either pass the command through without modification or implement local buffering in order to improve performance of the system. This allows a high degree of flexibility to an implementer to balance cost versus performance parameters.

The system provides that for any memory range that can be mapped as a communication channel, there be one component that is the root of the hierarchy. It is likely that this component will be a buffering component (performance may not be optimal otherwise), but it is not necessary that it be so. It is this component's responsibility to manage requests that over-flow the system's buffering capability and map them into the backing memory.

This arrangement may be considered to be a "heap structure", for a single reader and single writer at fixed locations within the memory hierarchy, it behaves as a FIFO. For multiple readers/writers, in its lowest latency configuration it acts a weakly ordered message queue, which does not guarantee that requests from different writers will be kept in order, or that the order will be the same for different readers. An embodiment can choose to enforce additional rules if stronger ordering is required.

FIG. 1 shows an embodiment 100 of a hierarchy that includes agents 102, 104, 108, 112, 114 and 118. Agents 104, 108, 114 and 118 have associated buffers 106, 110, 116 and 120, respectively. Fabrics 122, 124 and 126 with associated filters 128, 134 and 140, respectively; and buffers 132, 138 and 144, respectively, are shown.

Figure 2:
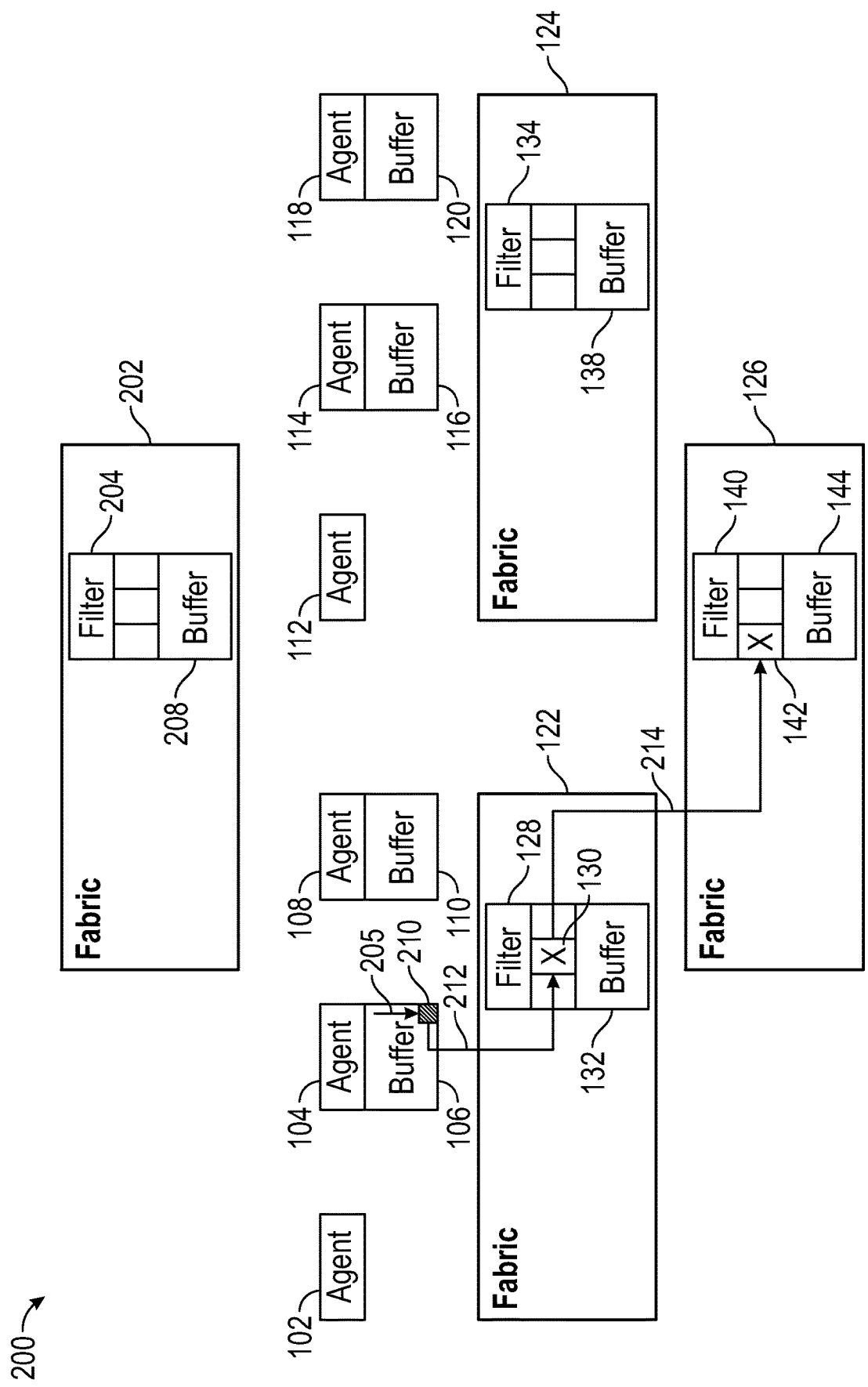
FIG. 2 illustrates a buffering agent "push" according to another embodiment of the disclosure.

FIG. 2 shows an embodiment 200 of a buffering agent push. As shown in FIG. 2, fabric 202 includes filter 204 and buffer 208. Agent 104 has a write task 210 that is to be stored locally, but sends a notify message downstream informing downstream filters that there is data available upstream.

Agent 104 with buffer 106 has a write request, or task 210, via 205. The agent 104 sends a notify message downstream (212) to fabric 122, filter 128 and buffer 132, as shown by "x" in buffer location 130. This notify is sent, via 214 to buffer 144 of filter 140 of fabric 126, as shown by "x" 142 in buffer 144. The other elements of FIG. 2 have been discussed previously.

Figure 3:
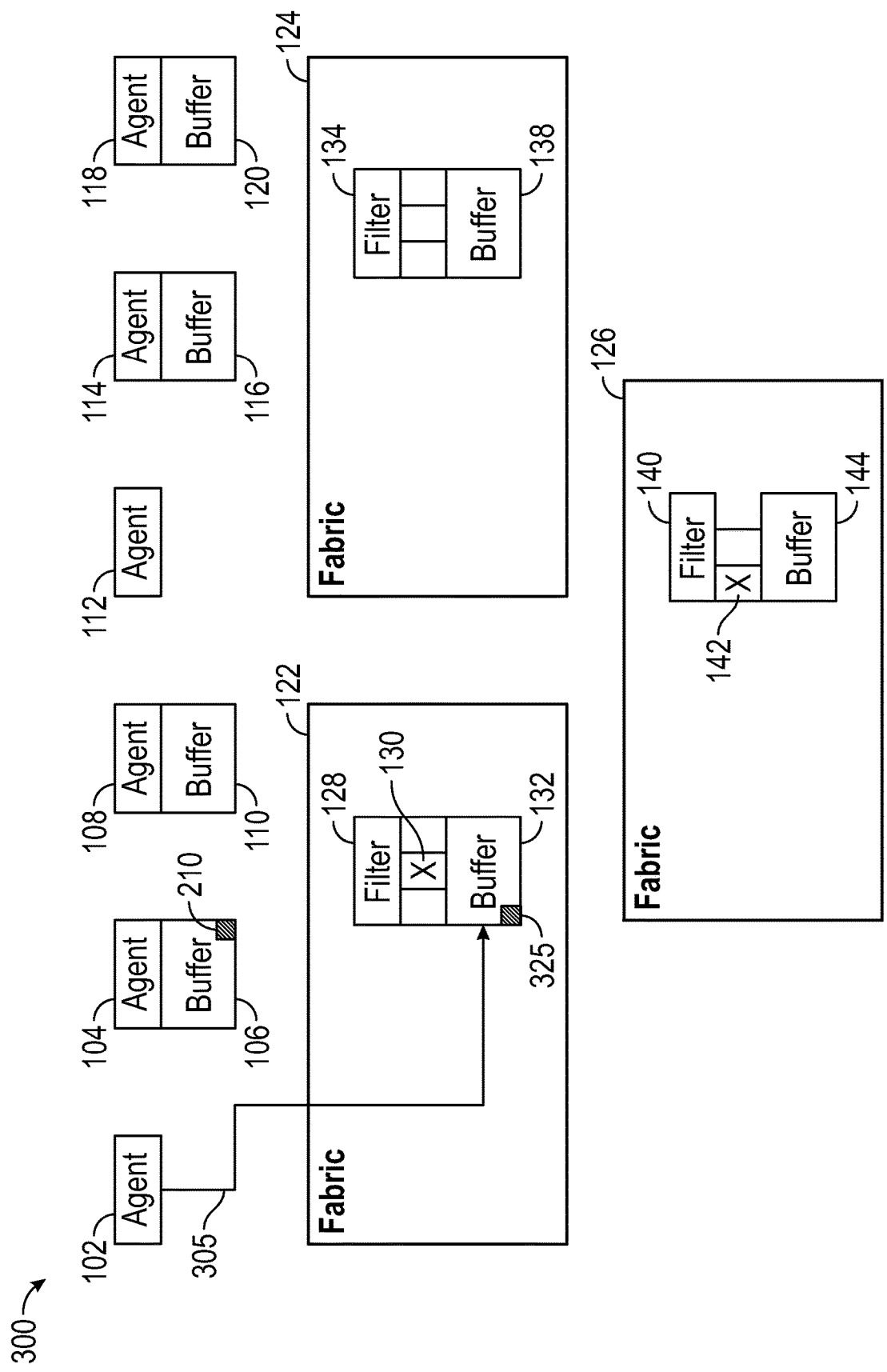
FIG. 3 illustrates a non-buffering agent "push" according to yet another embodiment described herein.

FIG. 3 shows non-buffering agent push embodiment 300. As shown in FIG. 3, agent 102, which does not include an associated buffer, pushes (305) a request to buffer 132 of fabric 122, as shown by element 325. The "x" of 130 and the "x" of 142, as shown in FIG. 2, remain. The other elements of FIG. 3 have been discussed previously.

Figure 4:
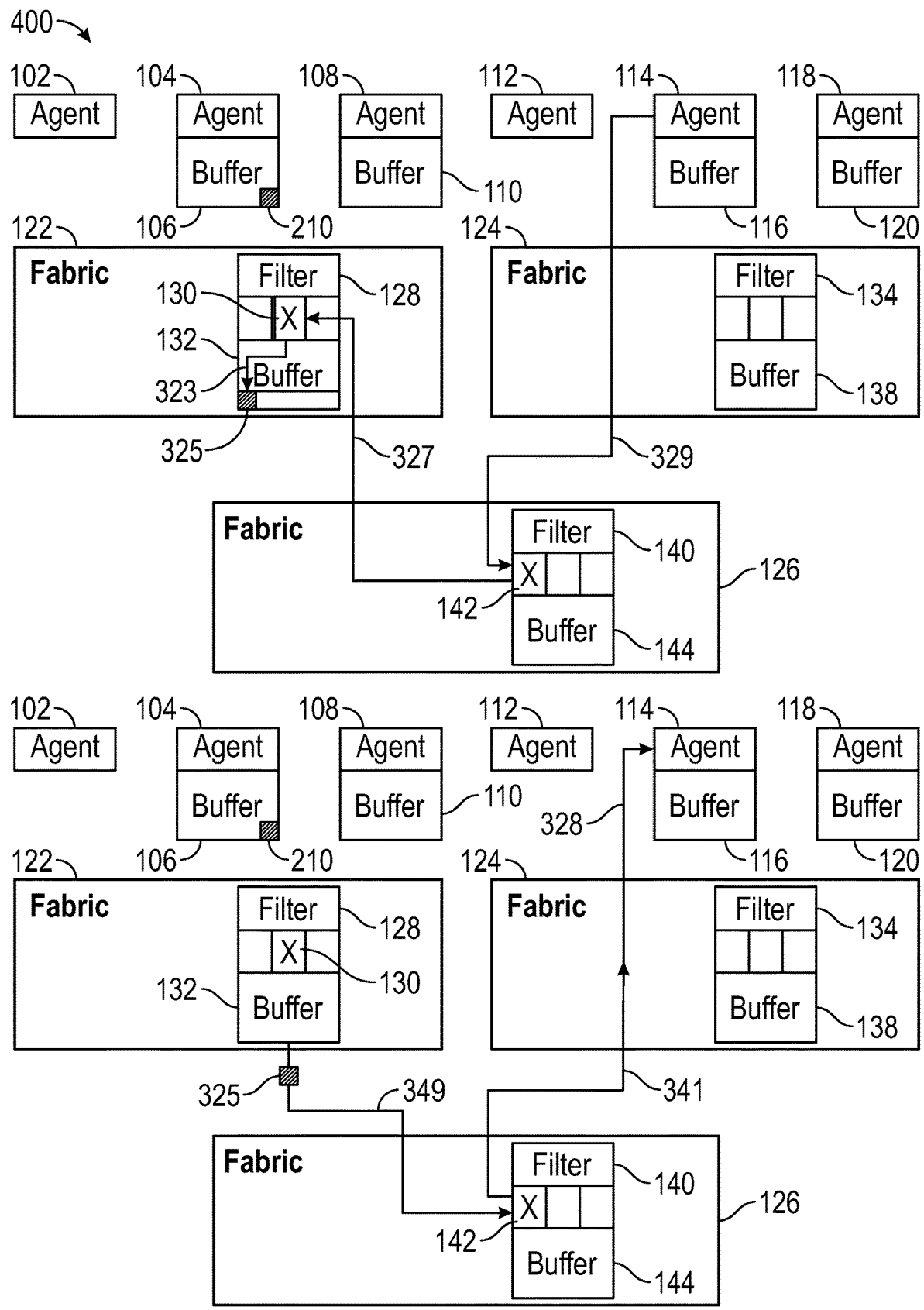
FIG. 4 illustrates a "take" embodiment according to yet another embodiment described herein.

FIG. 4 shows a "take" embodiment 400. As shown in FIG. 4, buffer 116 issues a "take" request (329) to filter 140 of fabric 126. Filter 140 sends a "take" request (327) to fabric 122. In response to the "take" request, data 325 is sent to buffer 144 of filter 140 of fabric 126, as shown by 349. Fabric 126 then provides a response (341, 328) to agent 114, which is the agent that initiated the "take". The other elements of FIG. 4 have been discussed.

Figure 5:
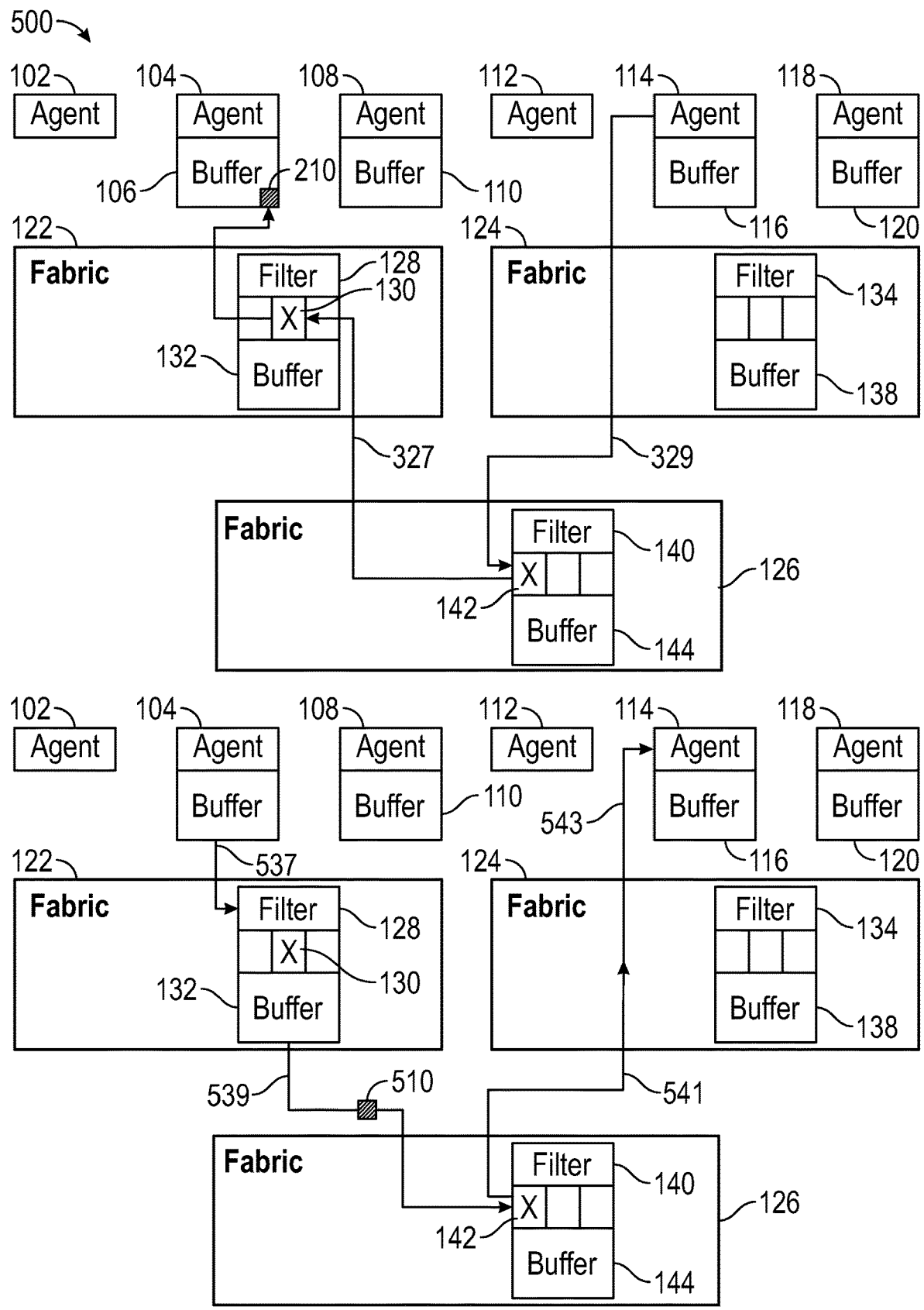
FIG. 5 illustrates another "take" embodiment according to yet another embodiment described herein.

FIG. 5 shows another embodiment 500 of a "take". As shown in FIG. 5, buffer 116 of agent 114 sends a "take" request 329 to filter 140. "x" 142 is shown in buffer 144. This "take" request is transferred (327) to buffer 106, which stores data 210. Also, as shown in FIG. 5, agent 104 sends response 537 to filter 128, which is then sends data 510 to filter 140, via line 539 and then from filter 140 to agent 114 via 541 and 543. The other elements of FIG. 5 have been discussed previously.

Figure 6:
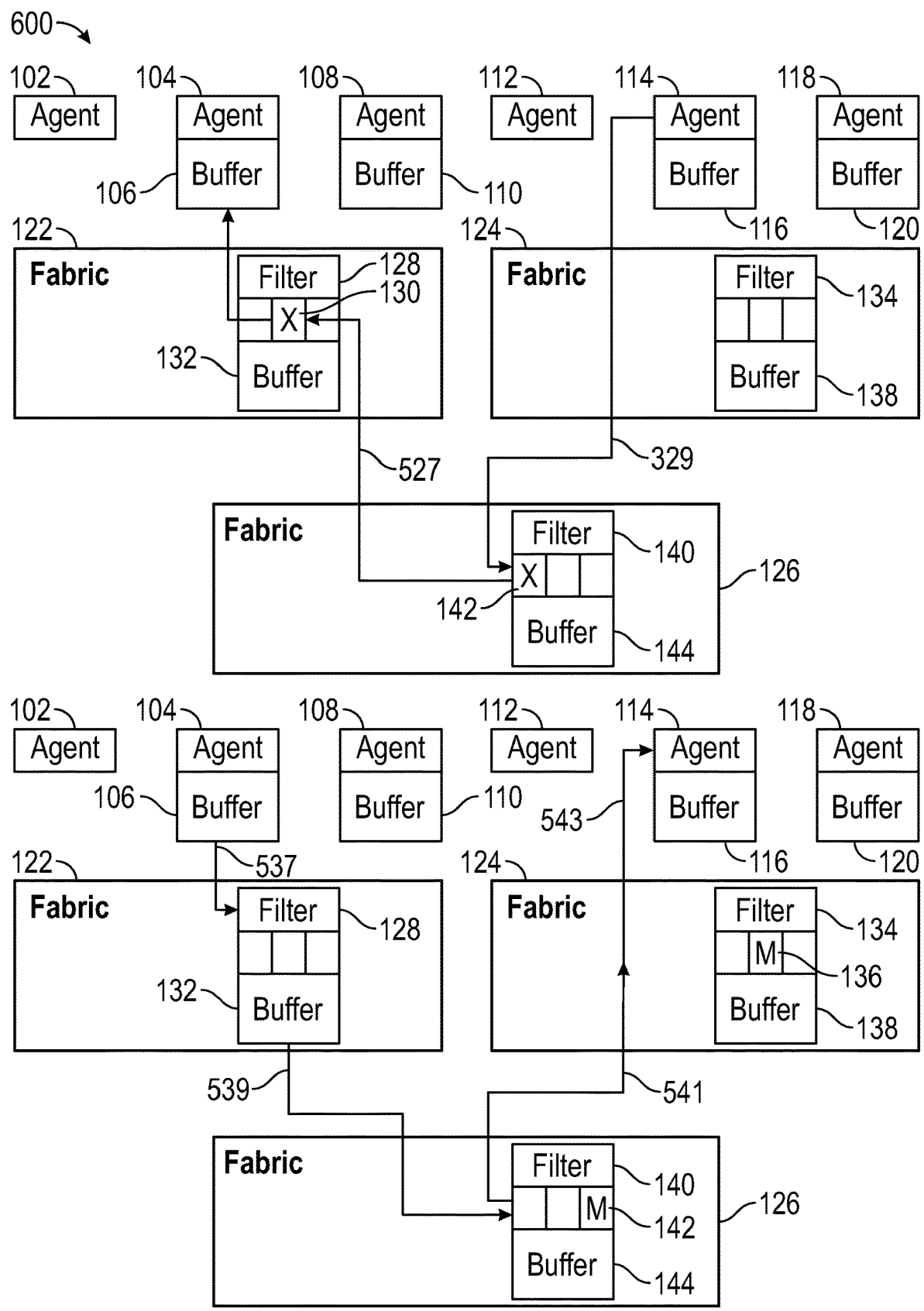
FIG. 6 illustrates yet another "take" (heap empty) embodiment according to yet another embodiment described herein.

FIG. 6 shows an embodiment 600 of a "take" with heap empty. As shown in FIG. 6, agent 114 issues a "take" request 329 to filter 140. This "take" request is sent from filter 140, via line 527 to buffer 106 of filter 104.

Agent 104, via buffer 106, sends a "miss" response 537 to filter 128 in fabric 122. Then filter 128 of buffer 132 sends a "miss" response 539 to filter 140 in fabric 126. "M" is stored in buffer 144 as element 142. The "M" is used to monitor the status and a filter (134) storing the "M" parameter may suitably be a snoop filter. "No data" message 541 is sent from filter 140 of fabric 126 to fabric 124, where nothing is stored, to agent 114 (via "no data" 543). Buffer 138 has "M" stored in element 136. Thus, filter 138 may also be a snoop filter. The other elements of FIG. 6 have been discussed herein.

Figure 7:
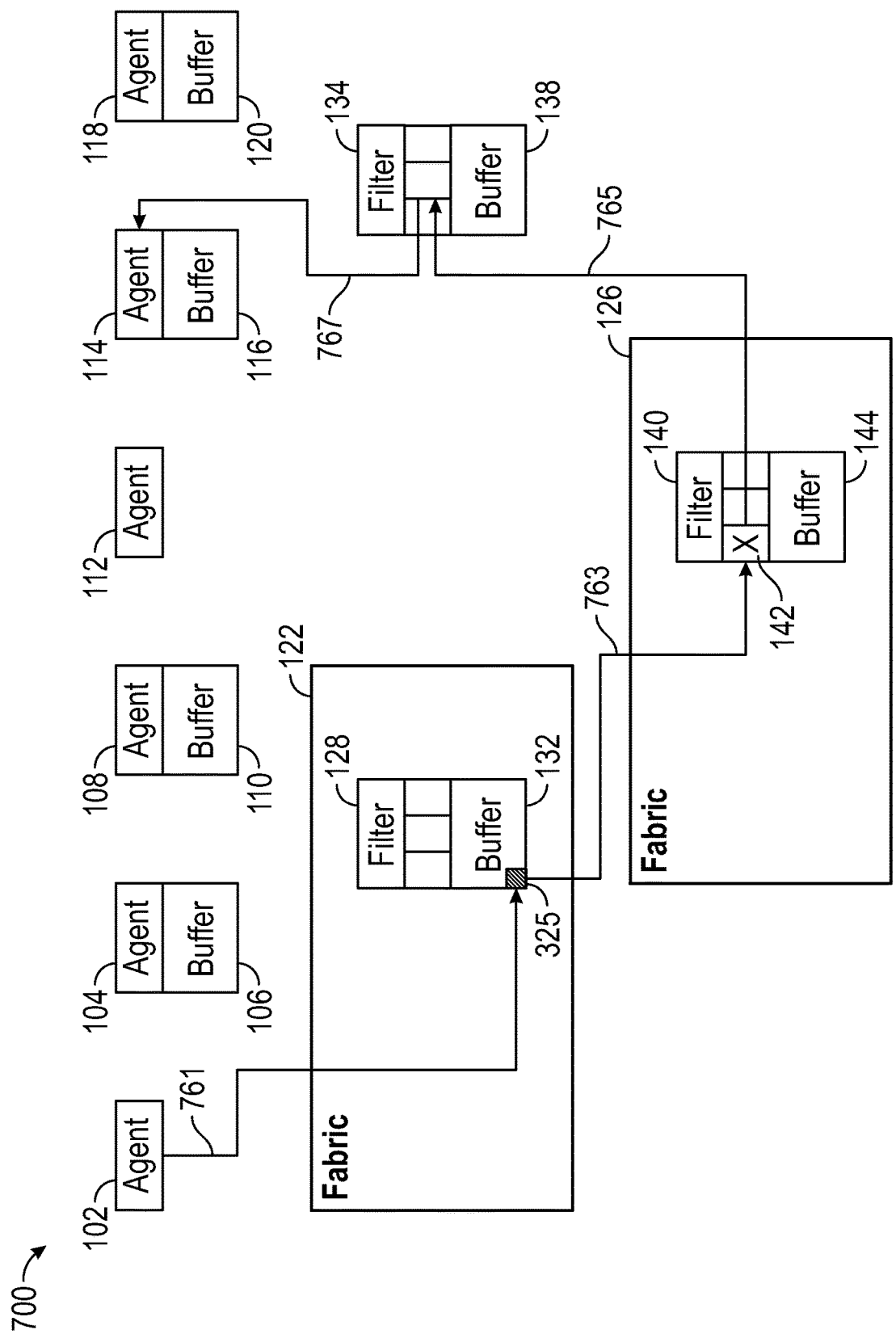
FIG. 7 illustrates a "push with notification" of a monitoring agent according to yet another embodiment described herein.

FIG. 7 shows an embodiment 700 of a push with notify of monitoring agent. Agent 102 sends a "push" 761 to buffer 132, of filter 128 of fabric 122, which has data 325 stored in buffer 132. Notify command 763 is sent from buffer 132 to filter 140 of fabric 126. "x" is stored in buffer location 142. Notify command 765 is sent from filter 140 of fabric 126 to buffer 138 of filter 134. Notify command 767 is sent from buffer 138 to agent 114. The other elements of FIG. 7 have been discussed herein.

Figure 8:
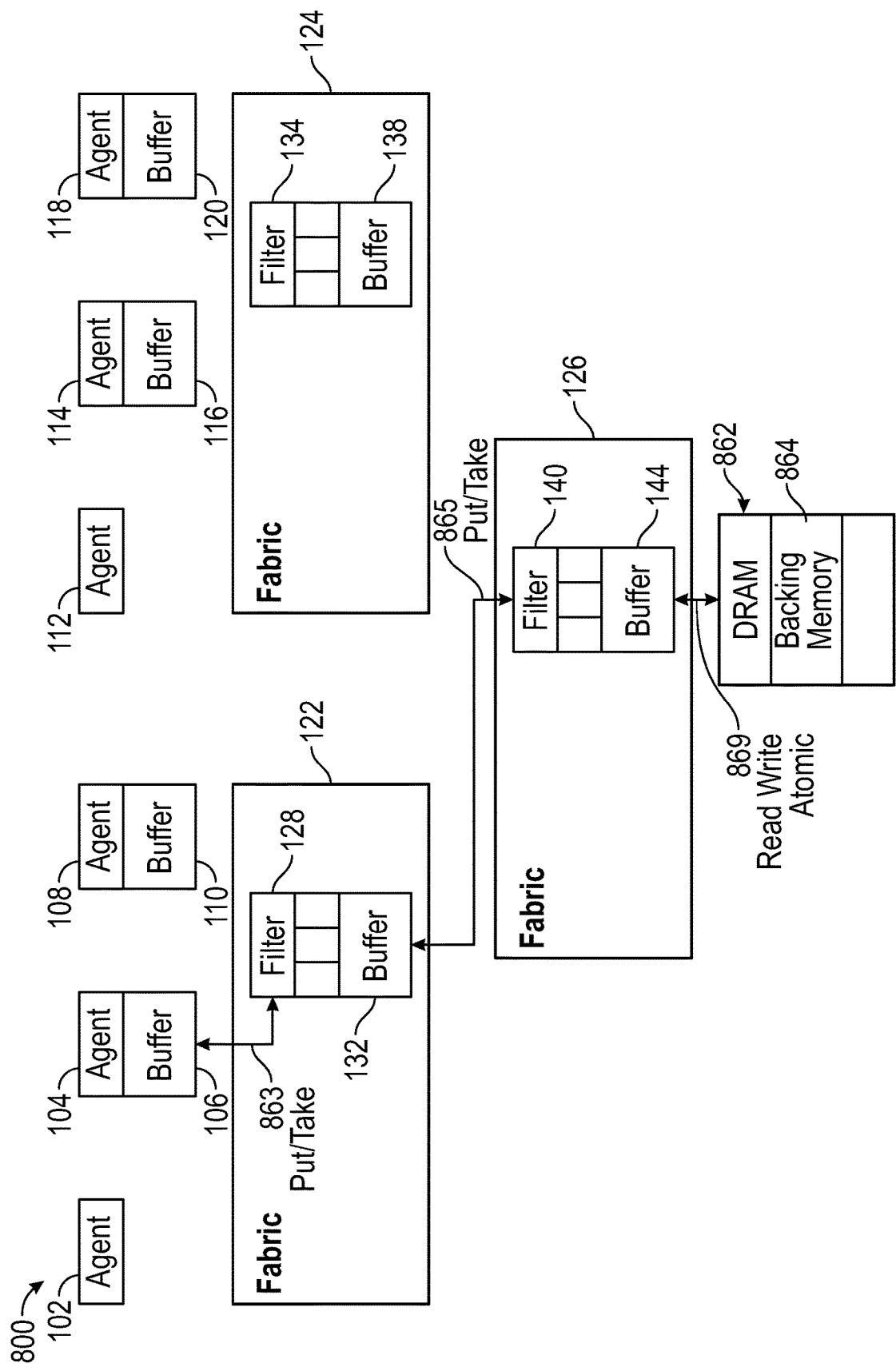
FIG. 8 illustrates a distributed heap, with local buffering and memory backed last stage according to yet another embodiment described herein.

FIG. 8 shows an embodiment 800 that includes a distributed heap, local buffering and memory backed last stage. Agent 104 sends a bi-directional "put/take" request 863 from buffer 106 to filter 128 of fabric 122. Bi-directional "put/take" request 865 is shown as going from buffer 132 of fabric 122 to filter 140 of fabric 126. A bi-directional Read Write Atomic 869 is transmitted between buffer 144 and DRAM 862, which is a final level. The final level 862 is at the root of the memory hierarchy for the distributed heap. A basic embodiment may support the final level using the backing memory 864 to store any overflow into memory in a way that preserves the required ordering of the messages. The other elements of FIG. 8 have been discussed herein.

Figure 9:
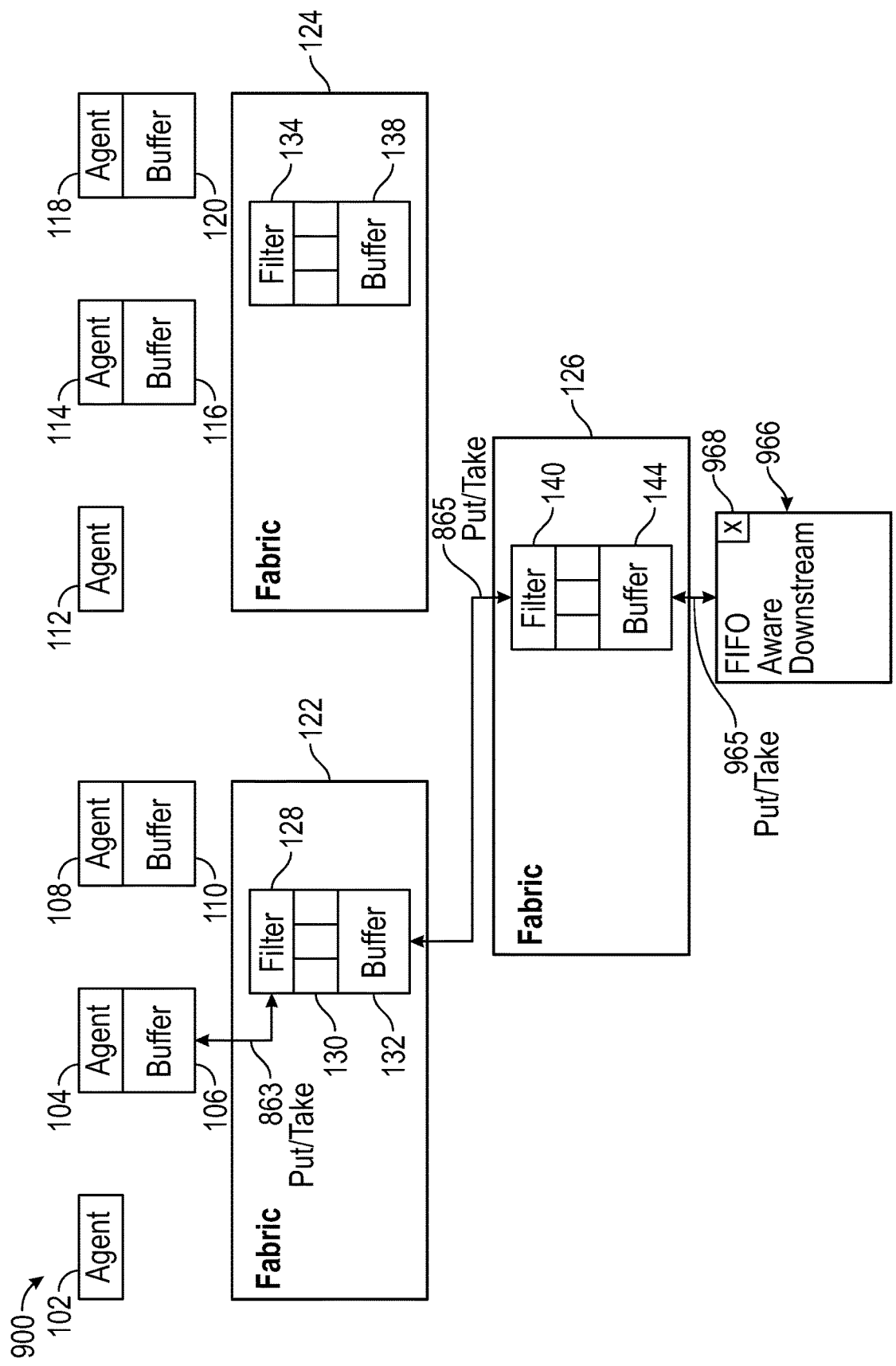
FIG. 9 illustrates a distributed heap, FIFO aware downstream according to yet another embodiment described herein.

FIG. 9 shows an embodiment 900 that has an additional option; the final level may be replaced with a device that is capable of communicating directly with channel semantics, such as an accelerator 966 downstream of all other agents 102, 104, 108, 112, 114 and 118. By generating appropriate notify events and disabling intermediate buffering, this allows a device to communicate directly with the agents in a secure and high-performance way. This is shown by FIFO aware module 966 communicating via "put/take" requests 965, 865 and 863 communicating with agent 104. "x" is shown as stored in 968. The other elements of FIG. 9 have been discussed herein.

Figure 10:
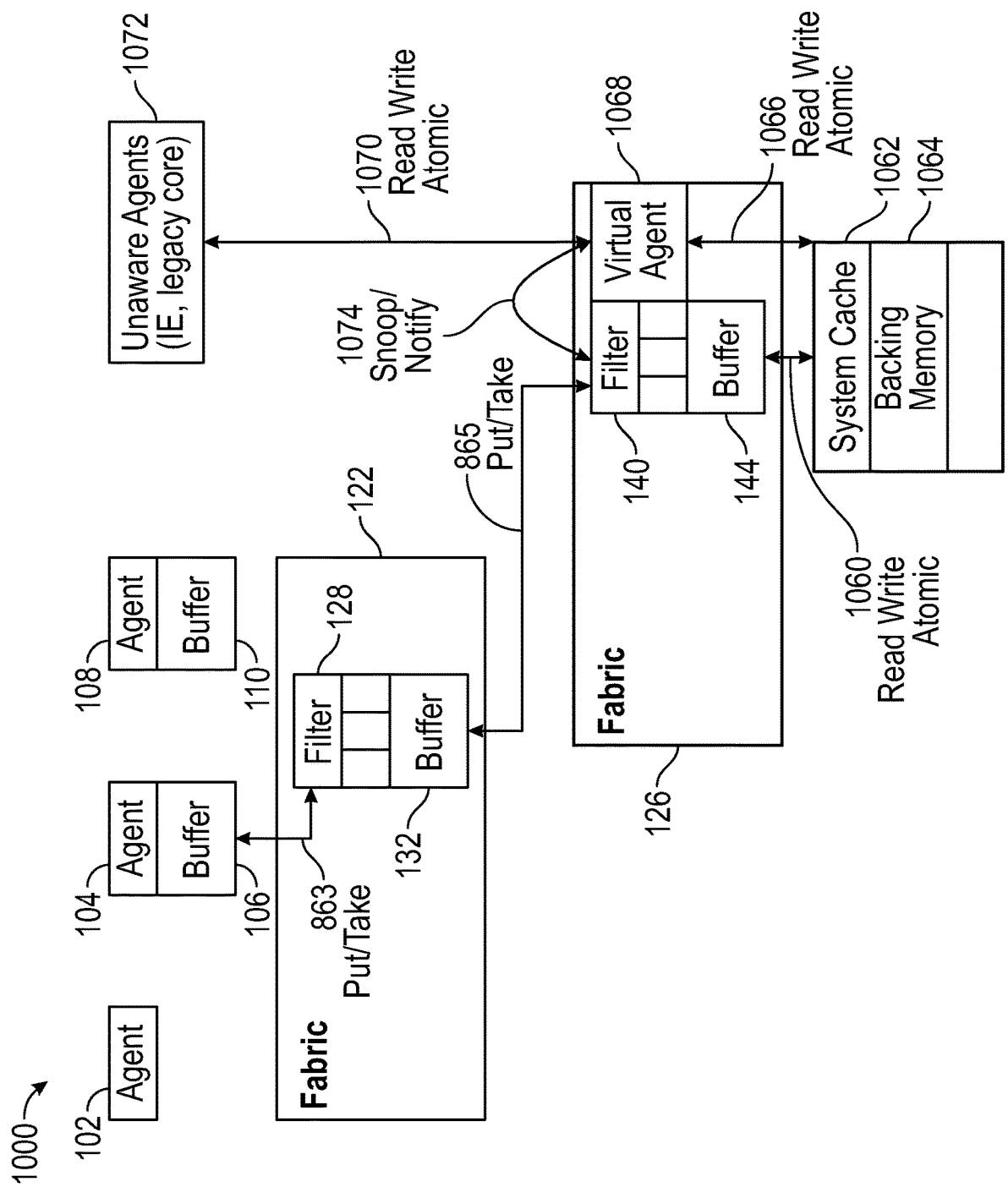
FIG. 10 illustrates an interaction with FIFO unaware agents according to yet another embodiment described herein.

FIG. 10 shows an embodiment 1000 with interaction with FIFO unaware agents. This is shown by agent 104 having bi-directional "put/take" 863 with filter 128 of fabric 122 and bi-directional "put/take" 865 between filter 128 of fabric 122 and fabric 126, which has filter 140 and buffer 144. System cache 1062 with backing memory 1064 is in bi-directional communication with fabric 126 via Read Write Atomic 1060. The system cache 1062 is also in bi-directional communication with virtual agent 1068 via Read Write Atomic 1066. Virtual agent 1068 has a snoop/notify 1074 to filter 140 and also Read Write Atomic 1070 with unaware agents (legacy core) 1072. The system cache 1062 may function in a way that is multi-process safe, which would allow an agent not implementing these commands to communicate with the channel, with the final level (system cache 1062) snooping its transactions (1074) to generate appropriate notify traffic. The other elements of FIG. 10 have been discussed herein.

Figure 11:
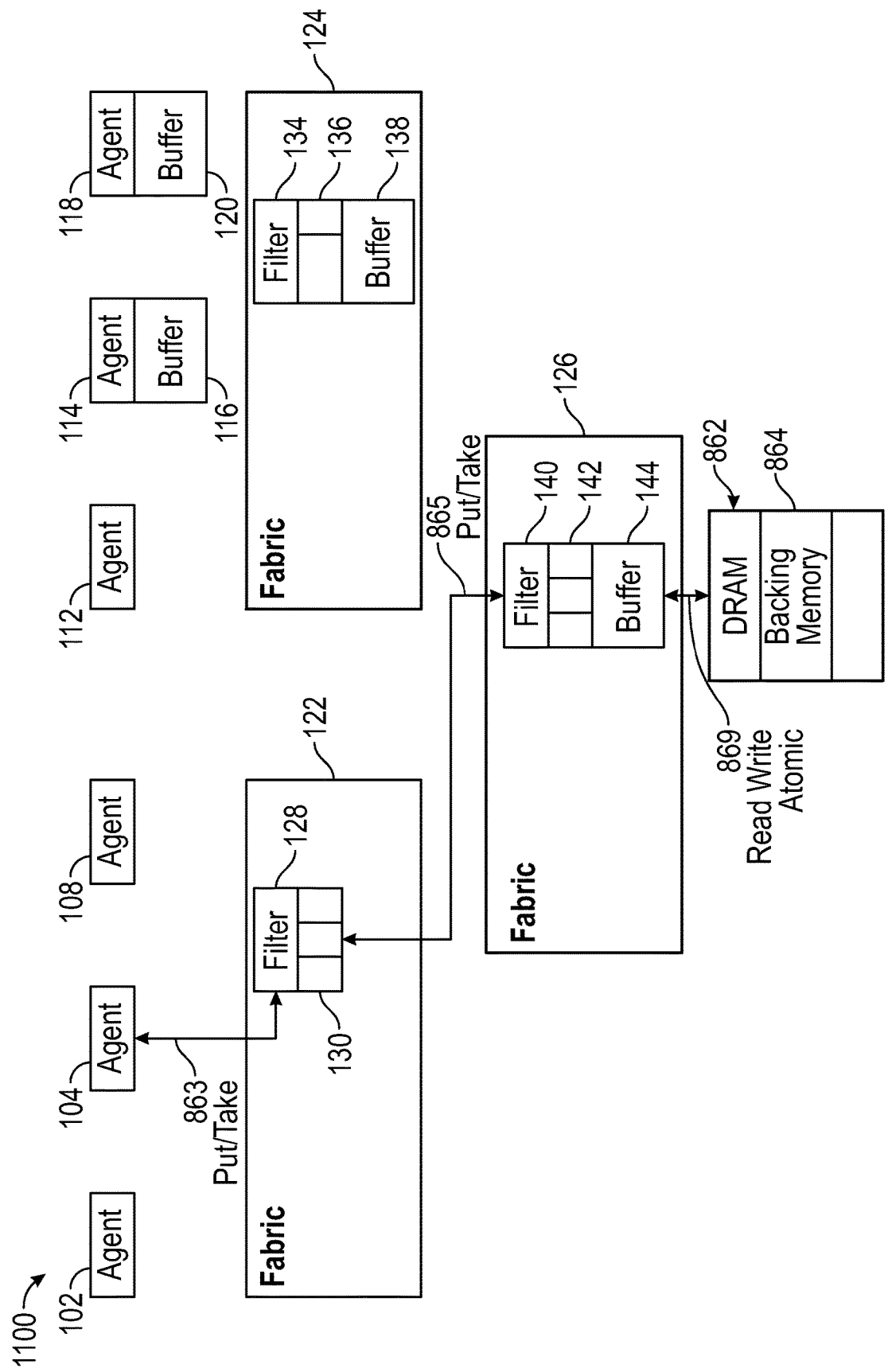
FIG. 11 illustrates asymmetric buffering according to yet another embodiment described herein.

FIG. 11 illustrates asymmetric buffering 1100 according to yet another embodiment described herein. FIG. 11 is similar to FIG. 8; however, in FIG. 11, agent 104, agent 108 and filter 128 do not have an associated buffer. The other elements of FIG. 11 have been discussed herein.

Figure 12:
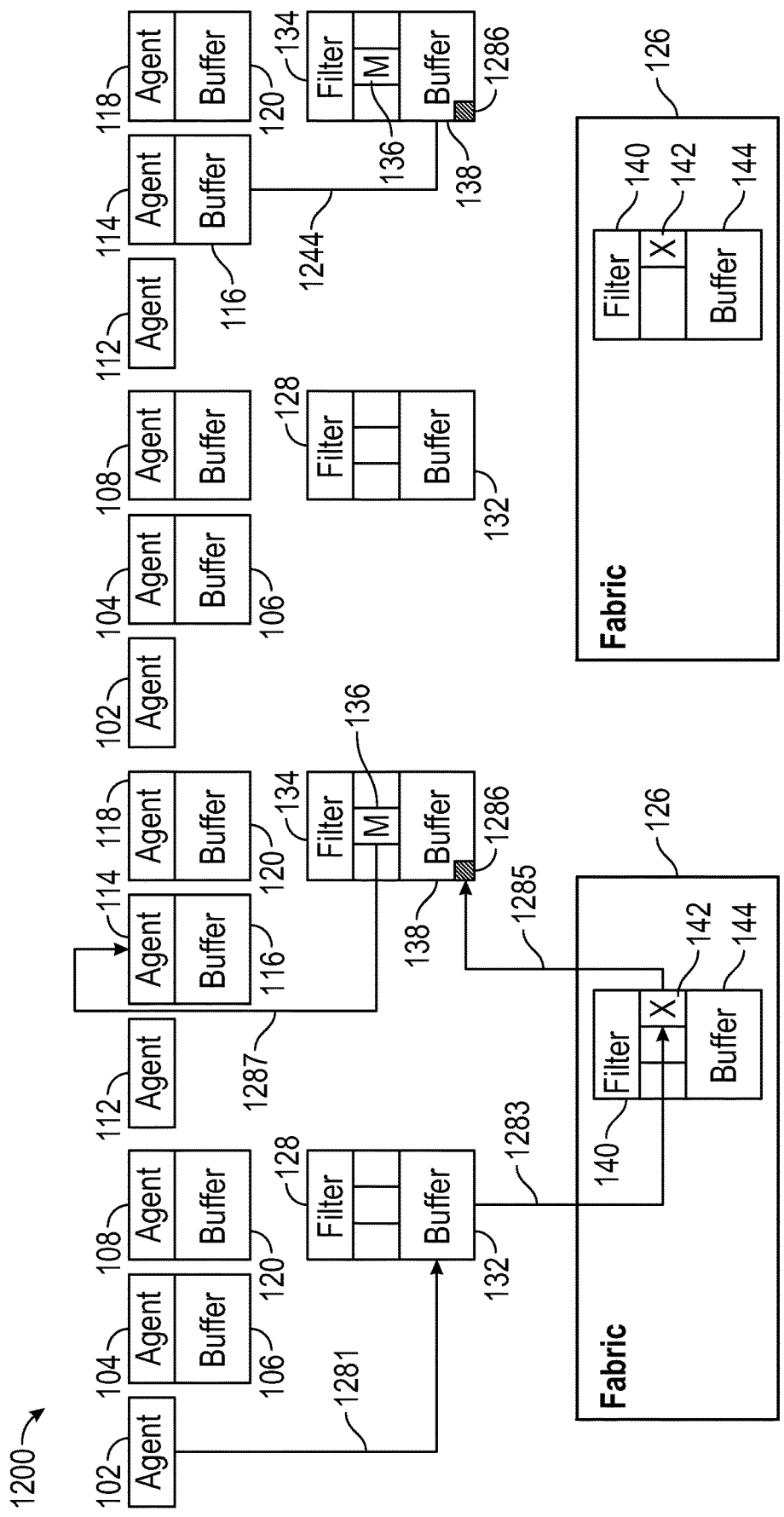
FIG. 12 illustrates a notify-push according to yet another embodiment described herein.

FIG. 12 shows a notify-push embodiment 1200. Data is sent, "pushed", from agent 102 via 1281, 1283 to filter 140 of fabric 126. Filter 134 receives the data 1286, via 1285 in buffer 138. As shown in FIG. 12, an additional option is to allow a "push" of data to backtrack to find the buffer nearest the agent that has left an "M" 136 in the filter 134. If the receiving agent 114 implements a buffer, this allows the message to be passed from the sender 102 to the receiver 114 with a cost of a single crossing of the memory of fabric 126, as shown in FIG. 12. The filter 134 can take data 1286 from agent 114 via 1244. "x" is stored in 142 of buffer 144. The other elements of FIG. 12 have been discussed herein.

Figure 13A:
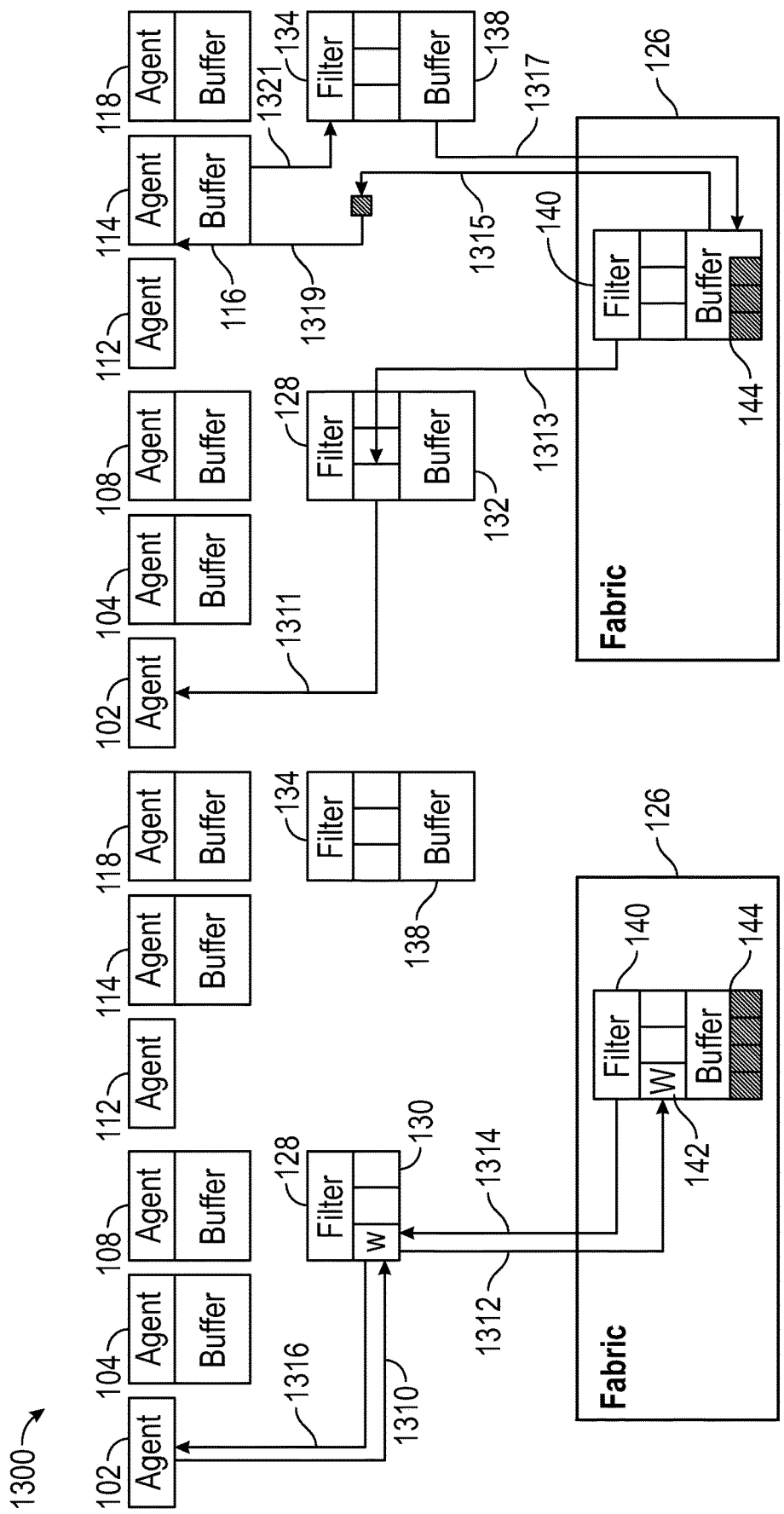
FIGS. 13A and 13B illustrate using a W (waiting to send) bit to notify a writer according to yet another embodiment described herein.
Figure 13B:
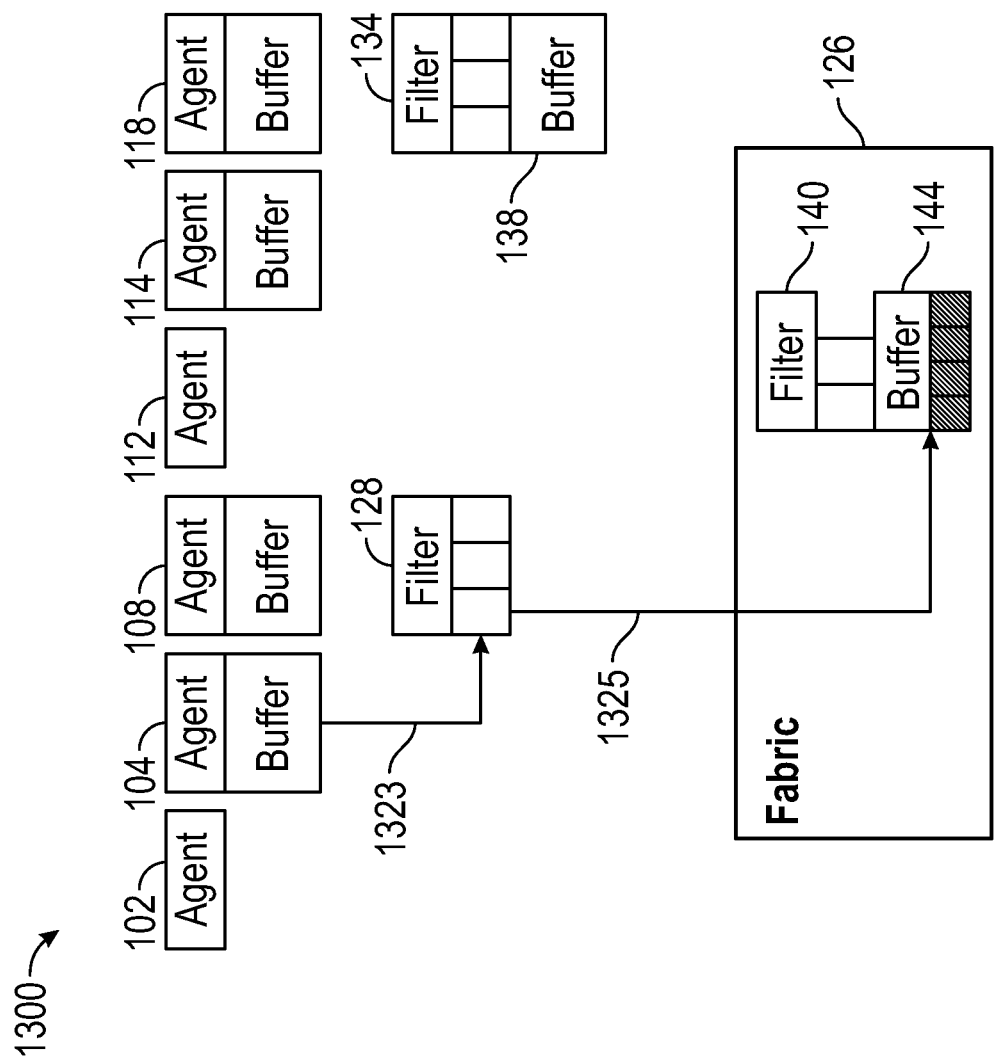

FIGS. 13A and 13B show an embodiment 1300 using a "W" (waiting to send) bit to notify a writer. Agent 102 puts data "W" to filter 128, via 1310. The "W" is put to fabric 126 buffer 144 in 142 via 1312. Fabric 126 notifies filter 128, via 1314, which is notified, via 1316, agent 102.

Agent 114 sends a "take" request 1321 to filter 134, which sends a "take" request 1317 to filter 140. Data is sent from buffer 144 of filter 140 to filter 134 via 1315. The data is sent from filter 134 to agent 114 via 1319. A notification is then sent from fabric 126 to filter 128 via 1313. This notification is sent from filter 128 to agent 102 via 1311.

Also, agent 104 can put data to filter 128 via 1323 and then filter 128 puts the data to buffer 144 of fabric 126 via 1325. The other elements of FIG. 13 have been described herein.

One of the most basic functions disclosed herein is the way in which a communication channel is defined, and how access in controlled. As such, the system includes some mechanism to assign traits to memory locations. Most cores will incorporate a memory translation mechanism or memory protection mechanism, which can serve this purpose. At a minimum, this mechanism may have the following additional capabilities:

To mark a memory region as part of a communication channel.

To assign permission to access the communication channel. Optionally, the following are also useful:

Indicate the order requirements of the channel.

A more general mapping to allow for other "structured access" styles.

Indicate a "message size" for the communication channel.

Indicate that the region mapped may be treated as a number of smaller communication channels, and the permission for each.

This is useful on systems where the smallest mappable region is large compared to the desired size of a communication channel.

The permission set for the communication channel may include the ability to distinguish between those mappings with "read" and "write" permission to the channel, optionally a "manage" permission and "no access" are also useful. Some systems may optionally include permissions that are predicated on the state of the process (such as if it is privileged).

The control line, can contain:

Pointers/counters to identify messages/bytes that are part of the channel and have been placed in memory.

Counters/Values representing how much storage the channel should use. This can be less than the amount mapped by the memory attributes.

Additionally, the control line may contain:

Counters to identify the amount of space reserved by upstream buffering agents.

An indication of message size (if not included in the memory attributes as above).

An indication of the order requirements of the memory channel.

The other bytes of the memory representing the channel may optionally be initialized, but it is not critical to functioning. If the embodiment contains an ability to set a "message size," setting this size to a single byte (or the smallest unit of addressable memory) may typically be equivalent to treating the accesses as a byte stream.

If the message size is set to something besides a byte, then that indicates that bus transactions moving data for this channel will transfer an integer multiple of that size. This means that messages of this size are not broken up by being mixed with other messages. It is described that a system will allow message sizes that efficiently map to its existing cache or bus hierarchy (such as powers of two, or multiples of the bus width up to a suitable maximum). For instance, in a current Arm® based system, the permitted message sizes would likely be a power of two bytes, up to one cache line size (currently 64 bytes). It is desirable that the message sizes available be defined such that all systems implanting the same architecture support a common set of sizes to facilitate code portability.

The individual bytes of the channel are typically not accessible, and addresses that fall within the mapped range of the channel are counted as referencing the channel. It is suggested that the channel be accessed by using the lowest address in the mapped region. For instance, in an "A-class" Arm® system, a channel might be mapped with a 4 KB mapping size, in which case the channel would be accessed by any accesses that have address bits of 12 or above matching those of the channel.

Optionally, the address bits that are not used to identify the channel may be used to carry its properties with the transactions instead of adding additional bits to the transactions with the memory system.

From a software perspective, once a memory region has been mapped as a communication channel, it can only be accessed with "put" or "take" commands, depending on if it has read or write permissions. An implementation may make several varieties of the "put" and "take" commands, for instance to allow for the source or destination to be different register sizes or type, or to be to or from a range of memory addresses (to facilitate sending complete messages). Optionally, a system may also make available commands that allow a message to be built over several commands and then sent at once. Optionally this would probably have to function similarly to transactional or "exclusive" memory, where if the instruction stream is disrupted (for instance by a context switch), the message construction will have to be repeated by the software.

Optionally, the "put" or "take" command may be blocking (prevent forward progress of the program) until it is able to complete (for instance a take may wait until data is available), instead of returning a to read/write. This blocking may optionally be configurable to time out after a given period of time. Most systems will consider this blocking to be interruptible, and that the command be repeatable (to allow the servicing of interrupts or pre-emptive multitasking).

Optionally, control may be handed over to the OS so that another, or subsequent, process can execute while the thread that failed to "put" or "take" from the channel is waiting.

Optionally, the system may generate an asynchronous event when it is notified that a channel it had previously waited to become available has become ready.

Optionally, this asynchronous event may contain information about which channel has become ready. If the event is not processed before the receipt of additional events, it is possible to store multiple records of the events, or to instead report that the storage for the notifications was exceeded, so all pending processes may be checked to see if they should repeat their access. If all of these options are implemented, the channel effectively has incorporated the functionality of a "doorbell" interrupt.

From the hardware side, a processing element or other element, which may comprise hardware elements and/or software elements, that wish to access the communication channel (an agent) has a responsibility to implement the bus command "put" and "take". These commands either put or take data from the communication channel. These commands are used to carry the address of the communication channel, as well as any additional information about its characteristics. These commands may return without transferring the data, and with an indication of activity, if the channel is full, the channel is empty, the attributes of the command do not match those of the channel's control line.

Optionally, a system, which may comprise hardware and/or software elements, or a combination of hardware and software elements, may support a partial data transfer if the channel can receive or provide part of the data requested. In these cases the response to the command may preferably indicate how much data was transferred.

An agent may optionally be configured to be able to wait to send data until space is available in the channel or wait to receive data when space is available. These functions use "notify" transactions, which are used to indicate to the agent when the channel is ready for data or a transaction. Optionally, these notify transactions can contain information about which channel is ready, and what type of transactions the channel is ready for. Efficient implementation of these notify transactions may optionally include a filter to reduce the number of unnecessary notifies that an agent receives. This is described in more detail herein.

If important information about the channel is contained in the control line (such as message size and ordering requirements), then the agent may issue a query as to the nature of the channel before it makes a request. In this embodiment, it is optional that the agent will be able to maintain a record of the state of at least the most recent, but possibly more channel states, similar to a TLB. An operation can be provided to invalidate them similar to how a TLB is invalidated. Optionally, this query may take the form of a null reservation request (size zero) or use a different mechanism.

Intermediate levels of the memory hierarchy pass these commands on to a final level, which is responsible for converting them into backing memory commands. Any intermediate level, the final level, or even one of the agents can contain a buffer. A buffer takes temporary responsibility for holding data related to the communication channel so that it does not need to travel further down the hierarchy. Buffers are optional but preferably present to some degree in high performance implementations. Optionally, the ordering requirements of the channel may result in some or all of the buffering components not being used for channels with stricter requirements (at a possible corresponding loss in performance).

For any intermediate component, which may be an agent, fabric, buffer, filter, etc., it is defined to be logically downstream from another component if requests from that other component for a particular channel must pass through it to reach the final level. A component is considered to be upstream of another component if that component is downstream from it. An agent is upstream, and the final level is downstream. For several embodiments described herein (such as the use of filters) to work, it is contemplated that for each channel, a component may be downstream from several other components directly linked to it, but may be logically upstream from one directly linked component, and is logically upstream from other components via that one directly linked downstream component. It is likely that the logical upstream/downstream concept is reflected in the physical topology of the design but may be more abstract. For example, the logical topology could be mapped onto a ring bus or mesh.

For ordering reasons, it is desirable for each level of buffering to behave as a FIFO internally, such that data exits the buffer in the same order it entered. For efficiency, most embodiments may make this typical. The buffer, while typically a temporary storage area, usually in RAM, the purpose of most buffers is to act as a holding area, enabling the CPU to manipulate data before transferring it to a device, agent, or other destination. To differentiate from other common uses of RAM, it is useful to define "a local RAM," as opposed to RAM that is generally used to refer to the system RAM, use of which is avoided if possible. It is likely some nodes will use a non-random-access storage element for at least part of the buffering (e.g., a hardware FIFO).

If buffering is used, optionally a buffer may make use of "reservation" commands, which reserve space in a lower level of the memory hierarchy for data. Optionally, reservation commands could be used to specify that non-volatile memory be used. This is preferable in general purpose systems so that it is possible for the buffers to be drained to memory, so that a higher-level entity may manage the allocations (e.g., operating system). If a reservation system is not used, an OS that wishes to "page out" the storage used for the data channel may have to wait for readers of the channel to catch up the writers. If the optional reservation scheme is used, additional bus commands could be included to return the reservation, and to request that the buffers drain their contents downstream or return their reservation. If buffering is used, an upstream or "snooping" version of a take transaction may be used to retrieve data that is needed by an agent on a different branch of the memory hierarchy.

In most implementations, some level of filtering may be used to prevent the unnecessary propagation of notify and take operations. The filter may take a form very similar to a snoop filter, with the possibility of several more states per upstream port. Despite having more states per line than a snoop filter, the filter has the potential to be much more efficient, since one entry corresponds to potentially large amount of transferred data. The filters described herein are typically hardware components. These filters are typically similar to a snoop filter. An embodiment is a large table tracking the state of a plurality of communication channels across all of the interfaces of that module.

One embodiment shows that the same amount of state as is held in the most current snoop filters, which would indicate that something on the upstream port is interested in the status of the channel. Other options involve tracking up to three more states for the upstream ports:

Data is available in a buffer (X in the figures)
Waiting to send (Win the FIG. 13A)
Monitoring to receive (Min the figures).

These states are optional, but implementing all of them, and the optional asynchronous event tracking above may greatly increase the efficiency of the system. The figures illustrate how these values can be updated. FIGS. 1-7 show a system implementing X and M bit options. Additionally, an extra 2 bits are optional to track the state of the downstream port:

a. A bit to indicate that a notify has already been sent for the line since the last time data was sent, so a further notify is not needed.
   b. A bit to track setting the M bit in the next level snoop filter since the last notification has been received. This allows searches for data to avoid searching downstream inefficiently.

An additional option is to allow a "push" of data to backtrack to find the buffer nearest the agent that has left an "M" in the snoop filter (filter 134 may be a snoop filter). If the receiving agent implements a buffer, this allows the message to be passed from the sender to the receiver with a cost of a single crossing of the memory, as shown in FIG. 12.

The final level is at the root of the memory hierarchy for the distributed heap. A basic embodiment may support the final level using the backing memory to store any overflow into memory in a way that preserves the required ordering of the messages (as shown in FIG. 8).

Optionally, this final level may do so in a way that is multi-process safe, which would allow an agent not implementing these commands to communicate with the channel (as shown in FIG. 10), with the final level snooping its transactions to generate appropriate notify traffic.

As an additional option, the final level may be replaced with a device that is capable of communicating directly with channel semantics, such as an accelerator downstream of all other agents. This is shown in FIG. 9. By generating appropriate notify events and disabling intermediate buffering, this allows such a device to communicate directly with the agents in a secure and high-performance way.

There may be several final levels in the system, but for any given channel, there is one at a time. Optionally, the system could dynamically change the final level for a channel dynamically in order to minimize latency between the communicating endpoints. This could be moved to levels of the memory hierarchy that have the appropriate hardware and would follow flushing any channel data in buffers that exist between the old final level and a new final level.

The flush is mostly likely to push to the backing memory, but the buffered data could be migrated to the new final level instead. As discussed previously, it may be possible for the final level of the channel to be implemented in the same hardware as the last level of the cache. The degree to which this is useful depends on the structure of the memory system.

Use of intermediate level buffering enables the lowest latency of messages. If more than one reader or more than one writer are involved, the messages may be interleaved, and not necessarily in the same order between endpoints. Even if there is only one writer and one reader, if the local buffers exist but overflow, the FIFO-like ordering of messages could be lost if certain rules are not followed. These ordering rules may optionally be specified by memory translation or attribution, or in the control line of the channel.

If stricter ordering is required, there are several options:
   i. Intermediate buffers can be used if they are downstream of participating agents.
   ii. An agent may either have a sufficient reservation to send all messages or await a non-full completion response between messages.

For a stricter FIFO paradigm a single reader and single writer:
   1. Receiver checks downstream (skipped if monitoring and no notify)
   2. Receiver checks local buffer
   3. Receiver checks upstream (skipped if the snoop filter shows no upstream data).

4. An agent either has a sufficient reservation to send all messages or awaits a non-full completion response between messages.
5. If a process is migrated between agents, the buffers downstream of the agent it is departing, and the agent it is moved to, are flushed to the Final Level before its first access at the new location.

For a minimum latency:
1. Receiver checks local buffer
2. Receiver checks upstream (skipped if the snoop filter shows no upstream data)
3. Receiver checks downstream (this may be skipped if the last downstream check resulted in no data and registered as a monitor in the next level snoop filter).

For a desired lack of starvation:
1. The order is determined by a pseudorandom or round robin methodology.

Thus, as described herein, the embodiments are adapted to:

Improve the granularity of multi-processor algorithms by speeding communication.

Connect accelerators to the system, and the OS can set up communication channels between them and processes, allowing secure accesses to the accelerators without further OS calls.

Segregate security components to avoid side channel attacks. Latency is low enough between endpoints that the OS can open a channel to each process and receive remote system calls with latency as low as executing a context switch on the local core.

An agent can serve as a proxy for other agents across a high-speed network, allowing channels to exist between processes on remote machines.

More directly express software concepts in assembly code. Most communication/file accesses in software are already modeled as streams of bytes or messages.

Table 1 shows an overview of bus commands useful for the distributed heap.

| Bus Command | Description | Optional? | Direction |
| --- | --- | --- | --- |
| Put | Put data into a communication channel. May fail or only partially succeed. Optionally notifies other agents of data availability. Optionally sets up the system to notify the taking agent on space availability. | N | Downstream Opt: Upstream |
| Peek | Returns the number of bytes a take would return from the channel. | Y | Downstream Upstream |
| Take | Take data from a communication channel. May fail or only partially succeed. Optionally sets up the memory subsystem to notify the taking agent on data available. Optionally generates notify events for putting agents. | N | Downstream Opt: Upstream |
| Hint | Provides a hint that a given agent/port is likely to put/take additional data soon. Optionally specifies a likely number of put/take. May also hint that a given agent is the only agent to put or the only agent to take (to allow the system to optimize point to point channels) | Y | |
| Notify | Signals that data/space is available. Optionally implemented with MSHR associated credit counter to indicate last space available. | Y (but highly recommended) | Downstream Upstream |
| Push-Notify | Signals data is available and sends the data speculatively. | Y | Upstream |
| Reserve | Requests permission to locally buffer X bytes of a channel. Optionally, the response may indicate a number of bytes less than X that are effectively reserved. Reservation implicitly returned by puts. Optionally may return the characteristics of the channel as well (message size, ordering rules). | Y | Downstream |
| SetNonVolatile | Requests that the allocations be in NV, and that all additions flush to point of persistence by default, and that all read transactions occur atomically w.r.t. the non-volatile media | Y | Downstream/ Upstream |
| Return | Releases reserved bytes. | Y | Downstream |
| Flush_poc | Requests all buffers to push data to the level of buffering that is down stream of all agents. (used to maintain ordering when migrating processes with weakly ordered channels). | Y | Downstream Upstream |
| Flush | Requests all buffers to push data and release reservations. | Y | Downstream Upstream |
| INIT | (equivalent to make invalid) used by OS to make sure no caches have data in the address range before switching between "channel" and "memory" addressing modes. | Y | Downstream Upstream |
| Flush_invalid | All buffers drop their current data and reservations. Used prior to deallocating the channels backing memory. | Y | Downstream Upstream |

Table 2 shows an overview of suggested alternate instruction mappings for software. Adding new instruction may not be possible; however, channels can still be accessed by defining new behavior for existing memory instructions when they access a region of memory designated as a communication channel.

| Bus Command | Alternate instruction mappings to existing instructions (A = FIFO base cache line) |
|---|---|
| Put | Store [A + 1] (size of store must be multiple of message size). Interruptible stall on FIFO full. Ordered as Device Memory |
| Peek | Load [A] |
| Take | Load [A + 1] Interruptible stall on FIFO empty. Ordered as Device Memory |
| Put (non-blocking) | Store [A + 2] (size of store must be multiple of message size). Takes an exception of FIFO full. |
| Put (non-blocking) | StoreEx [A + 2] (size of store must be multiple of message size). Returns an EXFAIL on FIFO full. |
| Peek | Load [A] |
| Take (non-blocking) | Load [A + 2] Takes an exception of FIFO empty OR returns a "default message" possibly all zeros. |
| Take (non-blocking) | LoadPairEx [A + 2] Second operand set to 1 on a FIFO empty. |
| Hint | PRFM [A(+1, +2 . . .)] |
| Reserve | NA (microarchitectural) |
| SetNonVolatile | NA (microarchitectural support required, flushing to point of persistence) |
| Return | NA (microarchitectural) |
| Flush_poc | Clean and invalidate to PoC by VA [A] |
| Flush | Clean and invalidate by VA [A] |
| INIT | Make Invalid [A + 1 . . . A + N] |
| Flush_invalid | Invalidate by VA [A] |

One or more of the embodiments described above may be performed on a computing device. A computing device may be understood to be any device having a processor, memory unit, input, and output. This may include, but is not intended to be limited to, cellular phones, smart phones, tablet computers, laptop computers, desktop computers, personal digital assistants, graphical processing units, field programmable gate arrays, etc. Components of the computer may include, but are not limited to, a processing unit, a system memory, and a system bus that couples various system components including the system memory to the processing unit.

Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, FLASH memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Combinations of any of the above should also be included within the scope of computer readable media.

Any combination of one or more computer-usable or computer-readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device.

The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if desired, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to wireless, wire line, optical fiber cable, RF, etc.

Computer program code for carrying out operations may be written in any combination of one or more programming languages, including an object-oriented programming language such as Java, Smalltalk, C++, CC# or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present embodiments are described below with reference to flowchart illustrations and/or block diagrams of methods, apparatus, systems and computer program products according to embodiments. It will be understood that each block of the flowchart illustrations and/or block diagrams, and combinations of blocks in the flowchart illustrations and/or block diagrams, can be implemented by computer program instructions, or directly in hardware or logic gates, or as a configuration for a reconfigurable logic device (such as an FPGA).

These computer program instructions may be provided to a processor of a general purpose computer, special purpose computer, or other programmable data processing apparatus to produce a machine, such that the instructions, which execute via the processor of the computer, or other programmable data processing apparatus, create means for implementing the functions/acts specified in the flowchart and/or block diagram block or blocks. These computer program instructions may also be stored in a computer-readable medium that can direct a computer or other programmable data processing apparatus, to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer, or other programmable apparatus to produce a computer-implemented process such that the instructions which execute on the computer or other programmable apparatus, provide processes for implementing the functions/acts specified in the flowchart and/or block diagram block or blocks.

Unless stated otherwise, terms such as "first" and "second" are used to arbitrarily distinguish between the elements such terms describe. Thus, these terms are not necessarily intended to indicate temporal or other prioritization of such elements.

As will be appreciated by one skilled in the art, the disclosure may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "agent," "module" or "system." Furthermore, the embodiments may take the form of a computer program product embodied in any tangible medium of expression having computer-usable program code embodied in the medium.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

It can be seen that the apparatus, system and methodologies presented herein provide an advancement in the state of the art.

Accordingly, some of the disclosed embodiments are set out in the following.

A method ("the method") comprising: identifying a plurality of distributed processes; identifying a selected region of memory, in a memory system, for use as a communication channel, utilizing a labeling technique; determining, for each distributed process, an interaction with the communication channel; and accessing the communication channel for the interaction, by an associated distributed process, using one or more commands that combine data movement and control into one action that propagates through the memory system, where one or more components of the memory system can either pass the one or more commands through without modification or implement local buffering of one or more of the one or more commands.

Another embodiment is directed to the method, where one component is a root of a hierarchy of the distributed processes.

Another embodiment is directed to the method, further comprising: utilizing permissions in the determining the interaction with the communication channel.

Another embodiment is directed to the method, where the permissions include a prohibition to access the communication channel.

Another embodiment is directed to the method, further comprising: indicating one or more order requirements of the communication channel.

Another embodiment is directed to the method, further comprising: mapping the selected region of memory for additional access.

Another embodiment is directed to the method, further comprising: indicating a message size for the communication channel.

Another embodiment is directed to the method, where the selected region of memory is a plurality of communication channels having associated access.

Another embodiment is directed to the method, where a capacity of the communication channel is defined by the size of the region mapped.

Another embodiment is directed to the method, further comprising: establishing a control line corresponding to the communication channel, where the control line includes one or more pointers that identify bytes that have been placed in the selected region of memory.

Another embodiment is directed to the method, further comprising: identifying an amount of memory reserved by a buffering agent.

Another embodiment is directed to the method, further comprising: monitoring a status of a memory buffer.

Another embodiment is directed to the method, further comprising: generating one or more variable-sized messages; and delivering the one or more variable-sized messages atomically.

Another embodiment is directed to the method, further comprising: tracking data movement in the memory system.

Another embodiment is directed to the method, further comprising: tracking one or more agents that are awaiting an operation.

Another embodiment is directed to an apparatus ("the apparatus") comprising: one or more agents configured to establish a plurality of distributed processes; and a memory having a designated region for use as a communication channel, by utilizing an extension of a labeling technique; where the communication channel is accessed by a distributed process, using one or more commands that combine data movement and control into one action that propagates through the memory system, where one or more components of the memory can either pass the one or more commands through without modification or implement local buffering of one or more of the commands.

Another embodiment is directed to the apparatus, further comprising: a control line that includes one or more pointers that identify bytes that have been placed in the memory.

Another embodiment is directed to the apparatus, further comprising: a root of a hierarchy of the distributed processes that is used to either pass the one or more commands through without modification or implement local buffering of one or more of the commands.

Another embodiment is directed to the apparatus, further comprising: a buffer adapted to store a status identifier.

Another embodiment is directed to the apparatus, further comprising: permission commands that determine the interaction with the communication channel.

Another embodiment is directed to the apparatus, where the permission commands include a prohibition to access the communication channel.

Another embodiment is directed to the apparatus, where the communication channel includes a message size parameter.

Yet another embodiment is directed to an apparatus comprising: a processor; and a memory, operatively coupled to the processor, adapted to store instructions that when executed by the processor: identify a plurality of distributed processes; identify a selected region of memory for use as a communication channel, by utilizing an extension of a labeling technique; determine, for each distributed process, an interaction with the communication channel; and access the communication channel for the interaction, by an associated distributed process, using one or more commands that combine data movement and control into one action that propagates through the memory system, where one or more components of the memory system can either pass the one or more commands through without modification or implement local buffering of one or more of the commands.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

The invention claimed is:

1. A method comprising:
    identifying a plurality of distributed processes;
    identifying a selected region of memory, in a memory system, for use as a communication channel, utilizing a labeling technique;
    determining, for each distributed process, an interaction with the communication channel;
    utilizing permissions in the determining the interaction with the communication channel; and
    accessing the communication channel for the interaction, by an associated distributed process, using one or more commands that combine data movement and control into one action that propagates through the memory system,
    where one or more components of the memory system can either pass the one or more commands through without modification or implement local buffering of one or more of the one or more commands.

2. The method as claimed in claim 1, where one component is a root of a hierarchy of the distributed processes.

3. The method as claimed in claim 1, where the permissions include a prohibition to access the communication channel.

4. The method as claimed in claim 1, further comprising: indicating one or more order requirements of the communication channel.

5. The method as claimed in claim 1, further comprising: mapping the selected region of memory for additional access.

6. The method as claimed in claim 1, where the selected region of memory is a plurality of communication channels having associated access.

7. The method as claimed in claim 1, further comprising: establishing a control line corresponding to the communication channel,
    where the control line includes one or more pointers that identify bytes that have been placed in the selected region of memory.

8. The method as claimed in claim 1, further comprising: identifying an amount of memory reserved by a buffering agent.

9. The method as claimed in claim 1, further comprising: monitoring a status of a memory buffer.

10. The method as claimed in claim 1, further comprising: generating one or more variable-sized messages; and delivering the one or more variable-sized messages atomically.

11. The method as claimed in claim 1, further comprising: tracking data movement in the memory system.

12. The method as claimed in claim 1 further comprising: tracking one or more agents that are awaiting an operation.

13. An apparatus comprising:
    one or more agents configured to establish a plurality of distributed processes; and
    a memory having a designated region for use as a communication channel, by utilizing an extension of a labeling technique;
    where the communication channel is accessed by a distributed process, using one or more commands that combine data movement and control into one action that propagates through the memory system,
    where one or more components of the memory can either pass the one or more commands through without modification or implement local buffering of one or more of the commands;
    one or more permission commands that determine an interaction with the communication channel, where the one or more permission commands include a prohibition to access the communication channel.

14. The apparatus as claimed in claim 13, further comprising:
    a control line that includes one or more pointers that identify bytes that have been placed in the memory.

15. The apparatus as claimed in claim 13, further comprising:
    a root of a hierarchy of the distributed processes that is used to either pass the one or more commands through without modification or implement local buffering of one or more of the commands.

16. The apparatus as claimed in claim 13, further comprising:
    a buffer adapted to store a status identifier.

17. The apparatus as claimed in claim 13, where the communication channel includes a message size parameter.

18. An apparatus comprising:
    a processor; and
    a memory, operatively coupled to the processor, adapted to store instructions that when executed by the processor:
        identify a plurality of distributed processes;
        identify a selected region of memory for use as a communication channel, by utilizing an extension of a labeling technique;
        determine, for each distributed process, an interaction with the communication channel;
        utilize permissions in the determining the interaction with the communication channel where the one or more permission commands include a prohibition to access the communication channel; and
        access the communication channel for the interaction, by an associated distributed process, using one or more commands that combine data movement and control into one action that propagates through the memory system, where one or more components of the memory system can either pass the one or more commands through without modification or implement local buffering of one or more of the commands.

* * * * *